United States Patent
Nawata et al.

(10) Patent No.: US 7,948,695 B2
(45) Date of Patent: May 24, 2011

(54) OPTICAL ELEMENT POSITIONING APPARATUS, PROJECTION OPTICAL SYSTEM AND EXPOSURE APPARATUS

(75) Inventors: Ryo Nawata, Utsunomiya (JP); Makoto Mizuno, Utsunomiya (JP); Shigeyuki Uzawa, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/870,877

(22) Filed: Aug. 30, 2010

(65) Prior Publication Data

US 2010/0321803 A1    Dec. 23, 2010

Related U.S. Application Data

(62) Division of application No. 12/171,644, filed on Jul. 11, 2008, now Pat. No. 7,821,726.

(30) Foreign Application Priority Data

Jul. 18, 2007    (JP) ................................. 2007-186924

(51) Int. Cl.
    *G02B 7/02*    (2006.01)
(52) U.S. Cl. .................. 359/822; 359/811; 359/813
(58) Field of Classification Search .................. 359/822
    See application file for complete search history.

(56) References Cited

U.S. PATENT DOCUMENTS

| 5,265,034 A | 11/1993 | Breckenridge et al. |
| 2007/0183064 A1 | 8/2007 | Shibazaki |
| 2007/0260419 A1 | 11/2007 | Hagiwara |
| 2007/0263191 A1 | 11/2007 | Shibazaki |
| 2009/0225297 A1 | 9/2009 | Bleidistel et al. |
| 2009/0231561 A1 | 9/2009 | Arai |

FOREIGN PATENT DOCUMENTS

| JP | 2005-175177 A | 6/2005 |
| JP | 2006-250587 A | 9/2006 |

*Primary Examiner* — Jessica T Stultz
(74) *Attorney, Agent, or Firm* — Fitzpatrick, Cella, Harper & Scinto

(57) ABSTRACT

An optical element is moved in six-degrees-of-freedom. Three first displacement sensors are disposed on a base plate and measure respective displacement amounts of three mutually different points on the optical element in a first direction. A second displacement sensor measures a displacement amount of one point on the optical element in a second direction. Two third displacement sensors measure respective displacement amounts of two mutually different points on the optical element in a third direction. A transformation processor transforms the six measured displacement amounts. A calibration processor calibrates the transformed displacement amounts with a calibration matrix of which coefficients are previously obtained to calibrate the displacement amounts in the six-degrees-of-freedom, which have errors due to measurement errors of the displacement sensors. A controller outputs command values based on differences between the calibrated displacement amounts and target displacement amounts.

5 Claims, 11 Drawing Sheets $$\begin{Bmatrix} \Delta Xo \\ \Delta Yo \\ \Delta Zo \\ \Delta \theta xo \\ \Delta \theta yo \\ \Delta \theta zo \end{Bmatrix} = \begin{bmatrix} \text{CALIBLATION} \\ \text{MATRIX} \\ 22 \end{bmatrix} \begin{Bmatrix} \Delta X \\ \Delta Y \\ \Delta Z \\ \Delta \theta x \\ \Delta \theta y \\ \Delta \theta z \end{Bmatrix}$$

$\underbrace{\qquad\qquad}_{\text{MOVEMENT AMOUNTS 232}}$ $\underbrace{\qquad\qquad}_{\text{MOVEMENT AMOUNTS 32}}$

FIG. 10

$$\begin{bmatrix} \Delta Xo1 & \Delta Xo2 & \cdots & \Delta Xon \\ \Delta Yo1 & \Delta Yo2 & \cdots & \Delta Yon \\ \Delta Zo1 & \Delta Zo2 & \cdots & \Delta Zon \\ \Delta \theta xo1 & \Delta \theta xo2 & \cdots & \Delta \theta xon \\ \Delta \theta yo1 & \Delta \theta yo2 & \cdots & \Delta \theta yon \\ \Delta \theta zo1 & \Delta \theta zo2 & \cdots & \Delta \theta zon \end{bmatrix} = \begin{bmatrix} \text{CALIBLATION} \\ \text{MATRIX} \\ 22 \end{bmatrix} \begin{bmatrix} \Delta X1 & \Delta X2 & \cdots & \Delta Xn \\ \Delta Y1 & \Delta Y2 & \cdots & \Delta Yn \\ \Delta Z1 & \Delta Z2 & \cdots & \Delta Zn \\ \Delta \theta x1 & \Delta \theta x2 & \cdots & \Delta \theta xn \\ \Delta \theta y1 & \Delta \theta y2 & \cdots & \Delta \theta yn \\ \Delta \theta z1 & \Delta \theta z2 & \cdots & \Delta \theta zn \end{bmatrix}$$

$\underbrace{\qquad\qquad}_{\substack{\text{MOVEMENT} \\ \text{AMOUNT} \\ \text{MATRIX} \\ 252}}$ $\underbrace{\qquad\qquad}_{\substack{\text{MOVEMENT} \\ \text{AMOUNT} \\ \text{MATRIX} \\ 52}}$

FIG. 11

OPTICAL ELEMENT POSITIONING APPARATUS, PROJECTION OPTICAL SYSTEM AND EXPOSURE APPARATUS

This application is a divisional of copending U.S. patent application Ser. No. 12/171,644, filed on Jul. 11, 2008, and published as U.S. Patent Application Publication No. 2009/0021847 A1 on Jan. 22, 2009.

This application claims the benefit of Japanese Patent Application No. 2007-186924, filed on Jul. 18, 2007, which is hereby incorporated by reference herein in its entirety.

BACKGROUND OF THE INVENTION

The present invention relates to an optical element positioning apparatus that performs positioning of an optical element suitable for, for example, an exposure apparatus used in a lithography process of a device manufacturing process.

Semiconductor devices, such as semiconductor memories and logic circuits with a minute circuit pattern, are manufactured using a photolithography (exposure) technique. For this purpose, conventionally, a reduction projection exposure apparatus is used. The reduction projection exposure apparatus projects a circuit pattern drawn on a reticle (or mask) through a projection optical system onto a substrate, such as a wafer, to transfer the circuit pattern thereon.

A minimum dimension (resolution) transferable with the reduction projection exposure apparatus is proportional to a wavelength of light used for exposure, and inversely proportional to a numerical aperture (NA) of the projection optical system. Accordingly, a shorter wavelength results in a higher resolution. Consequently, in order to satisfy the recent need for miniaturization of semiconductor devices, the wavelength of the exposure light is being reduced. For example, as a light source of ultraviolet light, an ultra-high pressure mercury lamp (i-ray (wavelength: approximately 365 nm)), a KrF excimer laser (wavelength: approximately 248 nm) or an ArF excimer laser (wavelength: approximately 193 nm) is used.

However, since the miniaturization of semiconductor devices is progressing rapidly, there is a limit in the lithography using ultraviolet light. In order to efficiently transfer extremely minute circuit patterns on the order of $0.1\mu$ or less, a reduction projection exposure apparatus, which uses an extreme ultraviolet ray (EUV) (hereafter, referred to as an EUV exposure apparatus), has been developed. The wavelength of the extreme ultraviolet ray (EUV) is approximately 10 to 15 nm, which is further shorter than that of the ultraviolet light.

To achieve a high resolution exposure, the position and posture of optical elements, such as mirrors and lenses located within the projection optical system, have to be precisely measured, and the optical elements have to be positioned so that the wavefront aberration falls within a permissible value. To precisely measure the position and posture of the optical elements, for example, laser gauge interferometers, mounted on a measuring frame, whose installation surfaces are satisfactorily prevented from vibrations and which has a satisfactory rigidity, are desirably used. However, due to the actual disposition of the laser gauge interferometers, it is extremely difficult to measure the position and posture of the optical elements disposed within an optical element holding barrel of the projection optical system, from such a measuring frame.

Japanese Patent Laid-Open No. 2005-175177 discloses a method in which laser gauge interferometers are mounted on an optical element holding barrel, and the movement amount of optical elements (mirrors) is measured.

Japanese Patent Laid-Open No. 2006-250587 discloses a measuring apparatus in which first and second sensors are provided, whose measurement axes are previously adjusted in a first axial direction and a second axial direction, respectively. The measuring apparatus is provided with the first and second sensors (three for each) between an inner ring and an outer ring. Thereby, relationships in positions and postures of the inner ring and the outer ring in directions of X, Y, Z, $\theta x$, $\theta y$, $\theta z$ are calculated.

When the laser gauge interferometers are mounted on the optical element holding barrel as disclosed in Japanese Patent Laid-Open No. 2005-175177, mounting errors of the laser gauge interferometers cause Abbe errors, which cause errors in measurement results of the movement amounts of the mirrors. To reduce the measurement errors due to the mounting errors of the laser gauge interferometers, the positions of the laser gauge interferometers mounted on the optical element holding barrel and the spans between the laser gauge interferometers have to be precisely obtained. However, it is extremely difficult to precisely obtain the positions of the laser gauge interferometers mounted on the optical element holding barrel and the spans therebetween.

Even when the measuring apparatus is used, in which the first and second sensors, whose measurement axes are previously adjusted in the first and second axial directions, as disclosed in Japanese Patent Laid-Open No. 2006-250587, a measurement error caused from the mounting error of the measuring apparatus cannot be prevented.

BRIEF SUMMARY OF THE INVENTION

The present invention provides an apparatus that precisely positions an optical element in six-degrees-of-freedom (that is, in six freedom directions).

The present invention provides, according to an aspect thereof, an apparatus that includes an optical element and positions the optical element. The apparatus includes a holder configured to hold the optical element, a back plate configured to support the optical element via the holder, a mechanism configured to move the optical element in six-degrees-of-freedom, a base plate configured to support the back plate via the mechanism, three first displacement sensors disposed on the base plate and configured to measure respective displacement amounts of three mutually different points on the optical element in a first direction, a second displacement sensor disposed on the base plate and configured to measure a displacement amount of one point on the optical element in a second direction different from the first direction, two third displacement sensors disposed on the base plate and configured to measure respective displacement amounts of two mutually different points on the optical element in a third direction different from the first and second directions, a transformation processor configured to transform the six displacement amounts measured by the first, second and third displacement sensors into displacement amounts of the optical element in the six-degrees-of-freedom, a calibration processor configured to calibrate the displacement amounts transformed by the transformation processor, and a controller configured to output command values to the mechanism based on differences between the displacement amounts calibrated by the calibration processor and target displacement amounts of the optical element.

The present invention provides, according to another aspect thereof, an apparatus that includes an optical element and positions the optical element. The apparatus includes a holder configured to hold the optical element, a back plate configured to support the optical element via the holder, a mechanism configured to move the optical element in six-degrees-of-freedom, a base plate configured to support the back plate via the mechanism, three first displacement sensors disposed on the base plate and configured to measure respective displacement amounts of three mutually different points on the back plate in a first direction, a second displacement sensor disposed on the base plate and configured to measure a displacement amount of one point on the back plate in a second direction different from the first direction, two third displacement sensors disposed on the base plate and configured to measure respective displacement amounts of two mutually different points on the back plate in a third direction different from the first and second directions, a transformation processor configured to transform the six displacement amounts measured by the first, second and third displacement sensors into displacement amounts of the optical element in the six-degrees-of-freedom, a calibration processor configured to calibrate the displacement amount transformed by the transformation processor, and a controller configured to output command values to the mechanism based on differences between the displacement amounts calibrated by the calibration processor and target displacement amounts of the optical element.

The present invention provides, according to still another aspect thereof, a projection optical system including the above apparatus, and a structure configured to support the apparatus.

The present invention provides, according to yet still another aspect thereof, an exposure apparatus including the above projection optical system. The exposure apparatus exposes a substrate with light via the projection optical system.

The present invention provides, according to still another aspect thereof, a method of manufacturing a device, including the steps of exposing a substrate using the exposure apparatus, developing the exposed substrate, and processing the developed substrate to manufacture the device.

Other aspects of the present invention will be apparent from the embodiments described below with reference to the drawings.

BRIEF DESCRIPTION OF THE DRAWINGS

FIG. 10 illustrates a calibration matrix in Embodiment 1.

FIG. 11 illustrates the calibration matrix in Embodiment 1.

DETAILED DESCRIPTION OF THE EMBODIMENTS

Exemplary embodiments of the present invention will be described below with reference to the accompanying drawings.

Embodiment 1

While taking an EUV exposure apparatus as an example, an optical element positioning apparatus and a projection optical system mounted therewith, each of which is a first embodiment (Embodiment 1) of the present invention, will be described below.

Figure 1:
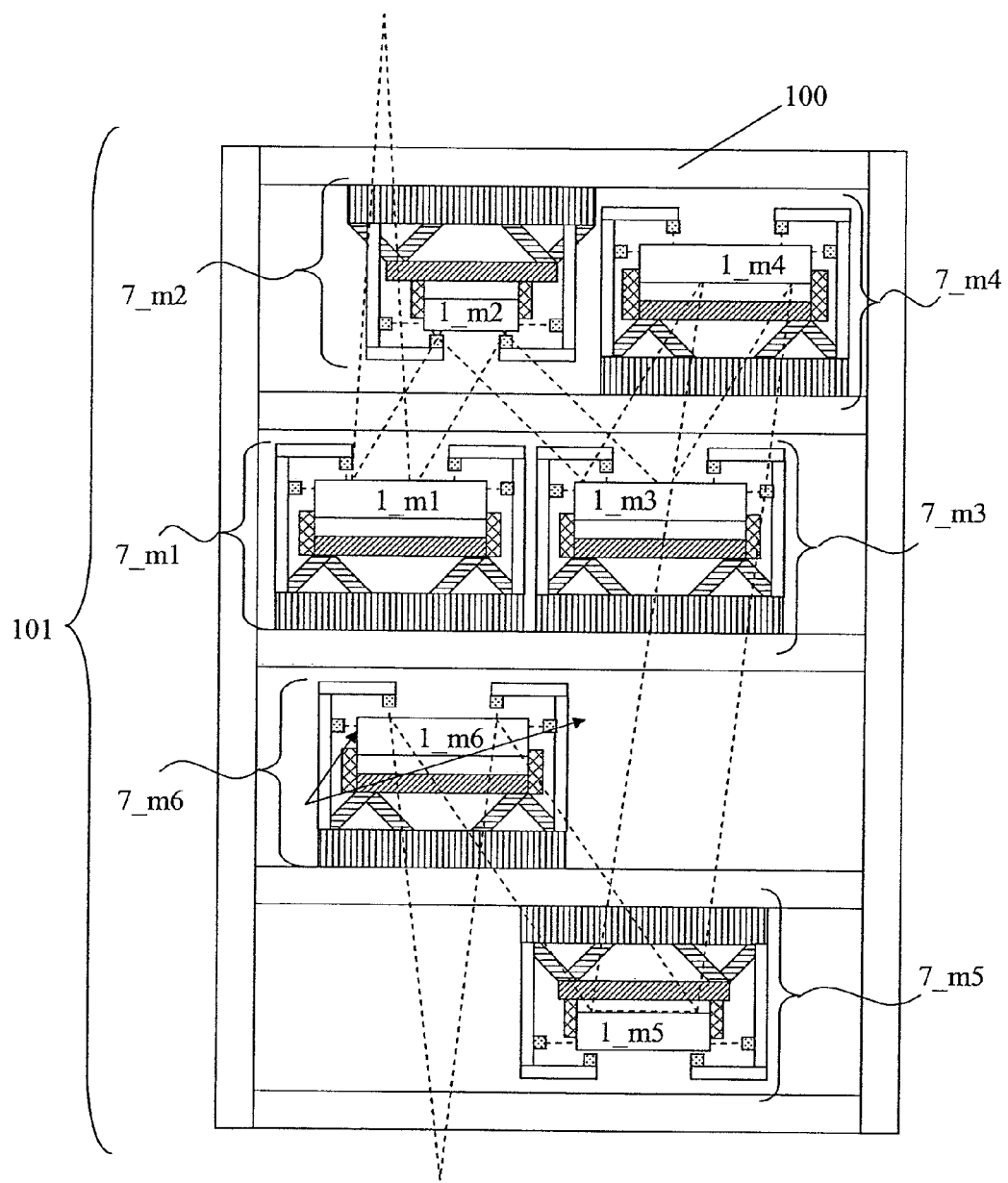
FIG. 1 is a side view schematically illustrating the configuration of a projection optical system that is Embodiment 1 of the present invention.

In many cases, a projection optical system, which is mounted on an EUV exposure apparatus, is constituted by six or eight optical elements (mirrors). In Embodiment 1, a description will be made of a projection optical system that includes an optical element holding barrel containing six optical elements 1 (1_m1 to 1_m6), as shown in FIG. 1.

The optical elements 1 (1_m1 to 1_m6) are respectively mounted on optical element positioning apparatuses 7 (7_m1 to 7_m6). A projection optical system 101 is constituted by mounting the optical element positioning apparatuses 7 on an optical element holding barrel 100.

Figure 2:
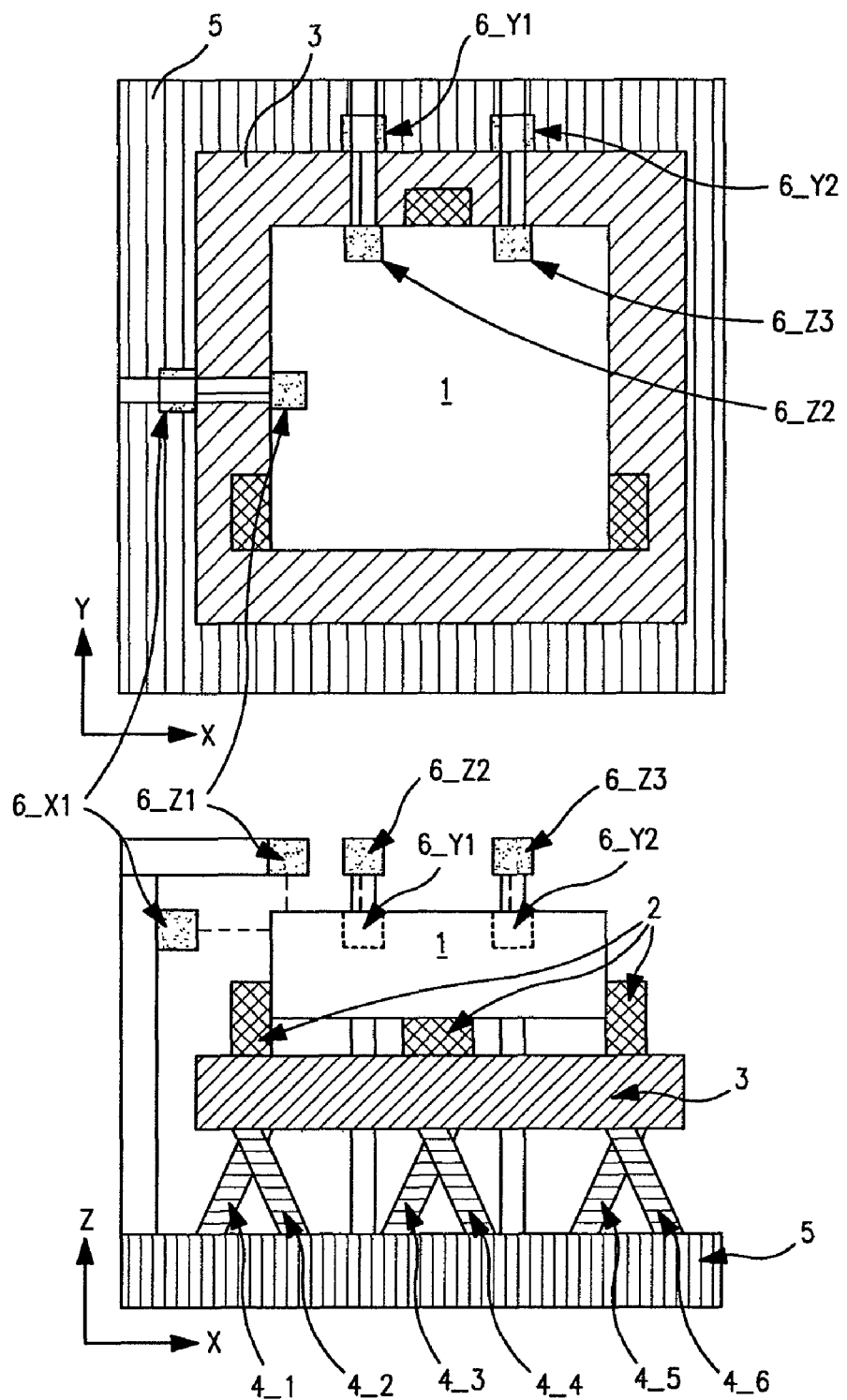
FIG. 2 shows a top view and a side view schematically illustrating the configuration of an optical element positioning apparatus of Embodiment 1.

FIG. 2 illustrates the configuration of one of the optical element positioning apparatuses 7. The optical element positioning apparatus 7 performs positioning of the optical element 1 in six-degrees-of-freedom in an orthogonal coordinate system, with respect to a base plate 5.

As shown in FIG. 2, a back plate 3 supports the optical element 1 through a holding mechanism 2. The base plate 5 supports the back plate 3 through position adjusting mechanisms 4 (4_1 to 4_6), which are displacing mechanisms.

Each of the position adjusting mechanisms 4 uses a parallel link mechanism. The parallel link mechanism includes a Stewart platform type, a direct acting type and a rotational type. Any one of the above types may be employed.

Each of the position adjusting mechanisms 4 (4_1 to 4_6) is provided with actuators. The actuators are capable of moving the optical element 1 in six-degrees-of-freedom (that is, in six freedom directions). A piezoactuator, a Pico motor, or the like, may be used as the actuator.

In Embodiment 1, each of the position adjusting mechanisms 4 employs the parallel link mechanism. However, if the positioning is possible freely in the six-degrees-of-freedom, a positioning mechanism using a linear motor may be employed.

The base plate 5 is provided with displacement sensors 6 (6_X1, 6_Y1, 6_Y2, 6_Z1, 6_Z2, 6_Z3), each of which measure a displacement amount of the optical element 1. A displacement sensor as a Michelson interferometry technique, a linear encoder, a capacitance sensor, or the like, which provides a satisfactory measuring accuracy and measurement range, may be used as each of the displacement sensors 6.

The displacement sensor 6_X1 measures a displacement amount $\Delta X1$ of the optical element in an X-axial direction with respect to the base plate 5. The displacement sensor 6_Y1 measures a displacement amount $\Delta Y1$ of the optical element 1 in a Y-axial direction with respect to the base plate 5. The displacement sensor 6_Y2 measures a displacement amount $\Delta Y2$ of the optical element 1 in the Y-axial direction with respect to the base plate 5.

The displacement sensor 6_Z1 measures a displacement amount ΔZ1 of the optical element 1 in a Z-axial direction with respect to the base plate 5. The displacement sensor 6_Z2 measures a displacement amount ΔZ2 of the optical element 1 in the Z-axial direction with respect to the base plate 5. The displacement sensor 6_Z3 measures a displacement amount ΔZ3 of the optical element 1 in the Z-axial direction with respect to the base plate 5.

The displacement sensors 6_Z1, 6_Z2 and 6_Z3 are three different first displacement sensors, which measure displacement amounts of three points different from each other in the optical element 1 in the Z-axial direction (first direction). The displacement sensors 6_X1, 6_Y1 and 6_Y2 are three second displacement sensors, which measure displacement amounts of three points different from each other in the optical element 1 in the X-axial direction and the Y-axial direction (in two directions different from the first direction and from each other).

The measurement information (ΔX1, ΔY1, ΔY2, ΔZ1, ΔZ2, and ΔZ3) obtained by the respective displacement sensors 6 is hereafter referred to as measurement information 31 of the displacement sensors 6.

Figure 6:
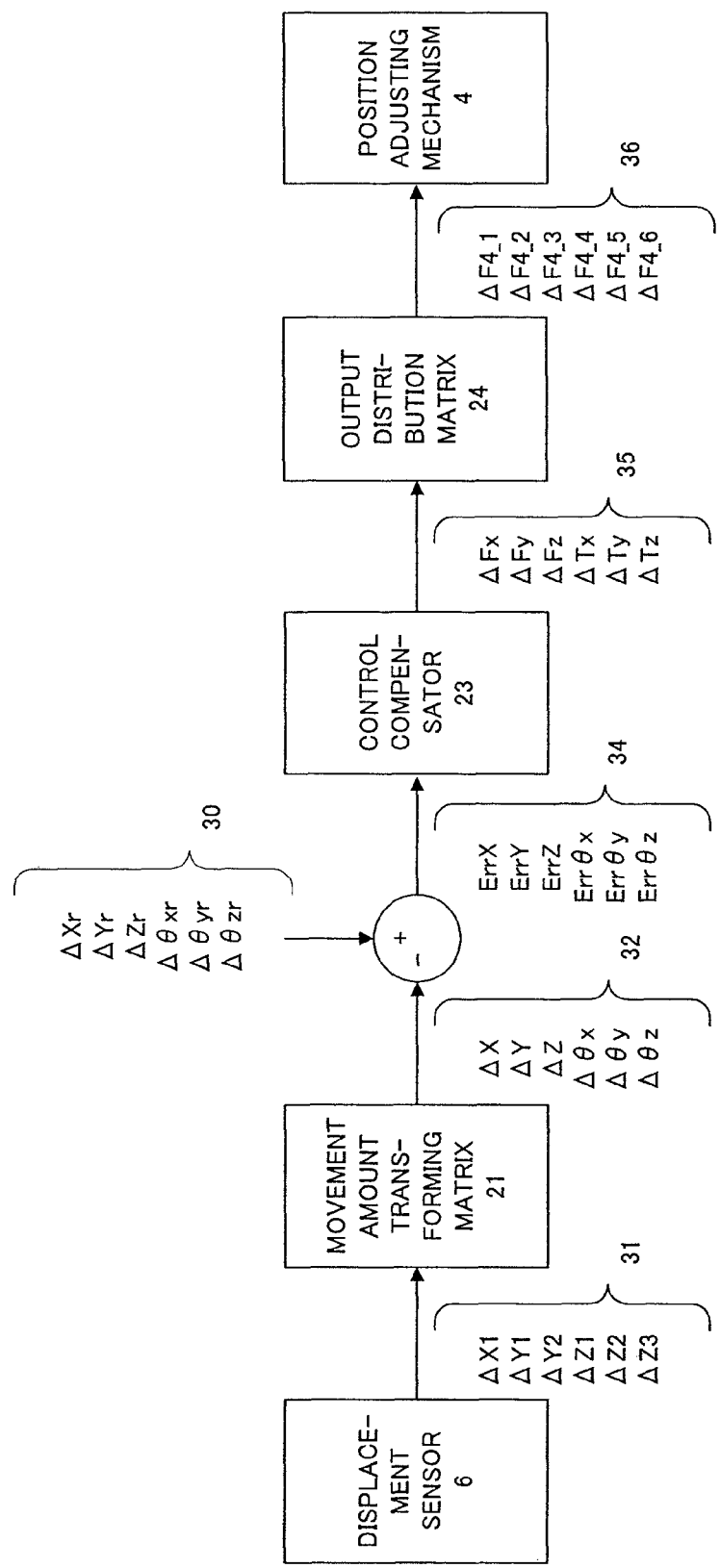
FIG. 6 is a block diagram illustrating a control method of the optical element positioning apparatus of Embodiment 1.

Referring to FIG. 6, a positioning control method of the optical element 1 will be described below.

The measurement information 31 of the displacement sensors 6 is transformed into movement amounts (displacement amounts) (ΔX, ΔY, ΔZ, Δθy, and Δθz) by a movement amount transforming matrix (transforming processor) 21. The movement amounts (ΔX, ΔY, ΔZ, Δθx, Δθy and Δθz) represent movement amounts of a control center of the optical element 1 in the six-degrees-of-freedom in the orthogonal coordinate system of the base plate 5. The movement amount transforming matrix 21 holds information on a positional relationship between the control center of the optical element 1 and the displacement sensors 6, and information on a mounted angle of each displacement sensor 6. The movement amounts (ΔX, ΔY, ΔZ, Δθx, Δθy and Δθz) of the control center of the optical element 1 in the six-degrees-of-freedom in the orthogonal coordinate system of the base plate 5 are hereafter referred to as movement amounts 32 of the optical element 1. The movement amounts 32 of the optical element 1 are input to a difference calculator 27.

The difference calculator 27 calculates control deviations 34 (ErrX, ErrY, ErrZ, Errθx, Errθy and Errθz) of the optical element 1 in the six-degrees-of-freedom, as described below. That is, differences between the movement amounts 32 ((ΔX, ΔY, ΔZ, Δθx, Δθy and Δθz) of the optical element 1 and target movement amounts 30 (ΔXr, ΔYr, ΔZr, Δθxr, Δθyr and Δθzr) of the optical element 1 are calculated to obtain the control deviations 34.

A control compensator 23 includes a PI compensator or a PID compensator, a notch filter, and a low-pass filter, and the like. The control compensator 23 calculates driving force information 35 (ΔFx, ΔFy, ΔFz, ΔTx, ΔTy and ΔTz) of the optical element positioning apparatus in the six-degrees-of-freedom, which are according to the control deviations 34.

An output distribution matrix 24 includes a transforming matrix that transforms the outputs from the position adjusting mechanism 4 into movement amounts of the optical element 1 in the six-degrees-of-freedom. The output distribution matrix 24 calculates command values for the following position adjusting mechanisms 4, based on the driving force information 35 (ΔFx, ΔFy, ΔFz, ΔTx, ΔTy and ΔTz). That is, the output distribution matrix 24 calculates a command value ΔF4_1 for the position adjusting mechanism 4_1, a command value ΔF4_2 for the position adjusting mechanism 4_2 and a command value ΔF4_3 for the position adjusting mechanism 4_3. Further, the output distribution matrix 24 calculates a command value ΔF4_4 for the position adjusting mechanism 4_4, a command value ΔF4_5 for the position adjusting mechanism 4_5 and a command value ΔF4_6 for the position adjusting mechanism 4_6.

Hereafter, the command values (ΔF4_1 to ΔF4_6) for the respective position adjusting mechanisms 4 (4_1 to 4_6) are referred to as command values 36 for the position adjusting mechanisms 4. The difference calculator 27, the control compensator 23 and the output distribution matrix 24 constitute a controller.

With the above-described configuration, the optical element position apparatus of Embodiment 1 can perform positioning control for the optical element 1.

However, the movement amounts 32 of the optical element 1 include mounting errors of the displacement sensor 6 and measurement errors of the displacement sensors 6, such as gain errors caused by measuring performance. Therefore, in this state, as they are, the optical element positioning apparatus 7 fails to satisfy required positioning accuracy. Accordingly, it is necessary to calibrate the movement amounts 32 of the optical element 1, which include measurement errors.

A calibration method of the optical element positioning apparatus 7 will be described below.

Figure 7:
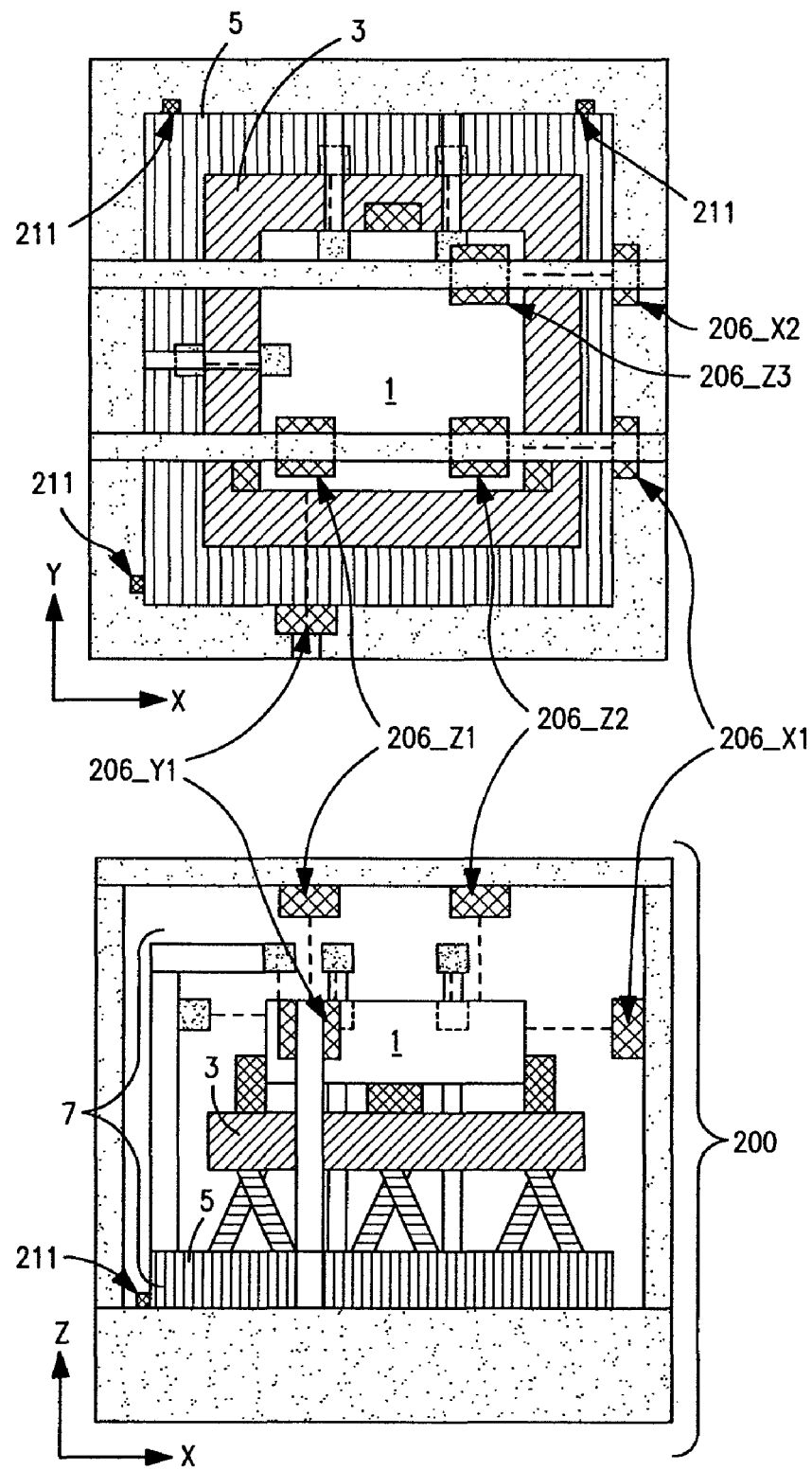
FIG. 7 shows a top view and a side view illustrating the configuration of a calibrator in Embodiment 1.

The calibration of the optical element positioning apparatus 7 is carried out using a calibrator 200. FIG. 7 schematically shows the calibrator 200.

The optical element positioning apparatus 7 is mounted on the calibrator 200, as shown in FIG. 7. A positioning mechanism 211 performs positioning of the base plate 5 in the optical element positioning apparatus 7 with respect to the calibrator 200.

The calibrator 200 is provided with displacement sensors 206 (206_X1, 206_X2, 206_Y1, 206_Z1, 206_Z2, 206_Z3) that measure displacement amounts of the optical element 1. A displacement sensor superior to the displacement sensor 6 in measurement performance (gain error is smaller) is used as the displacement sensor 206.

The displacement sensor 206_X1 measures a displacement amount ΔX1o of the optical element 1 in an X-axial direction with respect to the calibrator 200. The displacement sensor 206_X2 measures a displacement amount ΔX2o of the optical element 1 in the X-axial direction with respect to the calibrator 200. The displacement sensor 206_Y1 measures a displacement amount ΔY1o of the optical element 1 in a Y-axial direction with respect to the calibrator 200.

The displacement sensor 206_Z1 measures a displacement amount ΔZ1o of the optical element 1 in a Z-axial direction with respect to the calibrator 200. The displacement sensor 206_Z2 measures a displacement amount ΔZ2o of the optical element 1 in the Z-axial direction with respect to the calibrator 200. The displacement sensor 206_Z3 measures a displacement amount ΔZ3o of the optical element 1 in the Z-axial direction with respect to the calibrator 200.

Hereafter, the measurement information (ΔX1o, ΔX2o, ΔY1o, ΔZ1o, ΔZ2o and ΔZ3o) obtained by the displacement sensors 206 is referred to as measurement information 231 of the displacement sensor 206.

Figure 8:
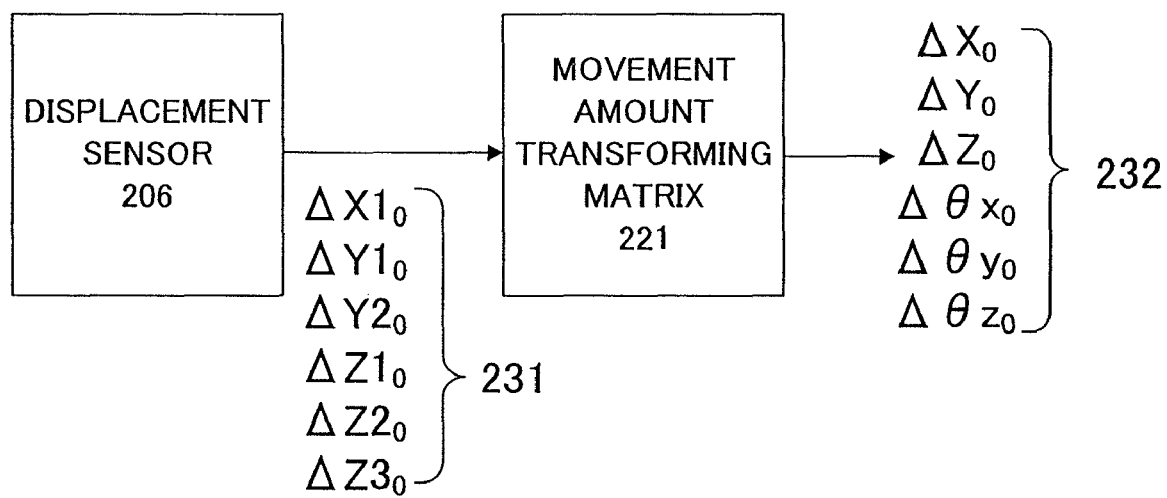
FIG. 8 is a block diagram illustrating a measurement-information processing method in the calibrator shown in FIG. 7.

A movement amount transforming matrix 221, shown in FIG. 8, transforms the measurement information 231 of the displacement sensors 206 into movement amounts (ΔXo, ΔYo, ΔZo, Δθxo, Δθyo and Δθzo) of the control center of the optical element 1 in the six-degrees-of-freedom of the calibrator 200.

The movement amount transforming matrix 221 holds information on a positional relationship between the control center of the optical element 1 and the displacement sensors 206, as well as information on a mounted angle of each displacement sensor 206. The information held by the movement amount transforming matrix 221, such as the positional relationship between the control center of the optical element 1 and the displacement sensors 206, and the mounted angle of each displacement sensor 206, can be precisely obtained by using a tool, or the like, which is specially manufactured for the calibrator 200. Hereafter, the movement amounts ($\Delta$Xo, $\Delta$Yo, $\Delta$Zo, $\Delta\theta$xo, $\Delta\theta$yo and $\Delta\theta$zo) of the control center of the optical element 1 in the six-degrees-of-freedom of the calibrator 200 are referred to as movement amounts 232 of the optical element 1.

When the optical element positioning apparatus 7 is mounted on the calibrator 200 to drive the optical element 1, the optical element positioning apparatus 7 can obtain the movement amounts 32 of the optical element 1 in the six-degrees-of-freedom of the base plate 5 from the measurement information 31 of the displacement sensors 6. The calibrator 200 can obtain the movement amounts 232 of the optical element 1 in the six-degrees-of-freedom of the calibrator 200 from the measurement information 231 of the displacement sensors 206.

The relationship between the movement amounts 232 of the optical element 1 with respect to the calibrator 200 and the movement amounts 32 of the optical element 1 with respect to the base plate 5 in the optical element positioning apparatus 7 can be expressed by a calibration matrix 22, as shown in FIG. 10.

When the optical element 1 is moved in n-variations, n-sets of the movement amounts 32 of the optical element 1 with respect to the optical element positioning apparatus 7 can be obtained. The n-sets of the movement amounts 32 can be expressed as movement amount matrix 52, as shown in FIG. 11. Likewise, the n-sets of the movement amounts 232 of the optical element 1 with respect to the calibrator 200 can be obtained, and the n-sets of the movement amounts 232 can be expressed as a movement amount matrix 252, as shown in FIG. 11.

Referring to FIG. 11, multiplying both sides of the expression by an inverse matrix of the movement amount matrix 52 can calculate the calibration matrix 22. To obtain the calibration matrix 22 for calibrating in the six-degrees-of-freedom, the optical element 1 has to be driven in at least six different positions and postures, and six or more sets of the movement amounts 32 and six or more sets of the movement amount 232 have to be obtained.

Figure 9:
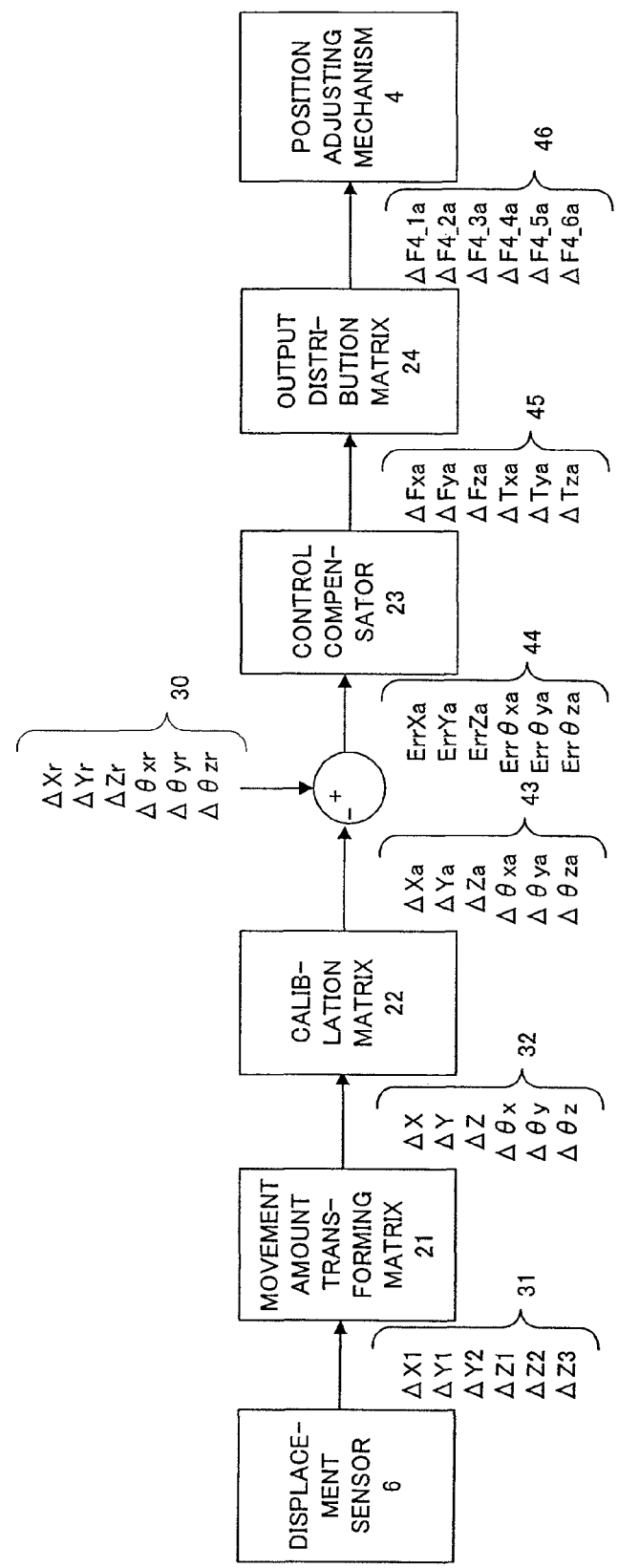
FIG. 9 is a block diagram illustrating a control method of the optical element positioning apparatus of Embodiment 1.

FIG. 9 shows a positioning control method by the optical element positioning apparatus 7 when the calibration matrix 22 is used.

The measurement information 31 of the displacement sensors 6 is transformed into the movement amounts 32 of the optical element 1 in the six-degrees-of-freedom in the orthogonal coordinate system by the movement amount transforming matrix (transformation processor) 21. The movement amounts 32 of the optical element 1 are transformed into calibrated movement amounts 43 ($\Delta$Xa, $\Delta$Ya, $\Delta$Za, $\Delta\theta$xa, $\Delta\theta$ya and $\Delta\theta$za) of the optical element 1 in the six-degrees-of-freedom by the calibration matrix (calibration processor) 22, the calibrated movement amounts 43 being input into the difference calculator 27.

The difference calculator 27 calculates control deviations 44 (ErrXa, ErrYa, ErrZa, Err$\theta$xa, Err$\theta$ya and Err$\theta$za) of the optical element 1 in the six-degrees-of-freedom, as described below. That is, differences between the calibrated movement amounts 43 ($\Delta$Xa, $\Delta$Ya, $\Delta$Za, $\Delta\theta$xa, $\Delta\theta$ya and $\Delta\theta$za) of the optical element 1 and the target movement amounts 30 ($\Delta$Xr, $\Delta$Yr, $\Delta$Zr, $\Delta\theta$xr, $\Delta\theta$yr and $\Delta\theta$zr) of the optical element 1 are calculated to obtain the control deviations 44.

The control compensator 23 includes a PI compensator or a PID compensator, a notch filter, a low-pass filter, and the like. The control compensator 23 calculates a driving force information 45 ($\Delta$Fxa, $\Delta$Fya, $\Delta$Fza, $\Delta$Txa, $\Delta$Tya and $\Delta$Tza) of the optical element positioning apparatus 7 in the six-degrees-of-freedom, which are according to the control deviations 44.

The output distribution matrix 24 holds the transforming matrix for transforming the outputs from the position adjusting mechanisms 4 into the movement amounts of the optical element 1 in the six-degrees-of-freedom. The output distribution matrix 24 calculates command values 46 ($\Delta$F4_1a to $\Delta$F4_6a) for the position adjusting mechanisms 4 (4_1 to 4_6), based on the driving force information 45 ($\Delta$Fxa, $\Delta$Fya, $\Delta$Fza, $\Delta$Txa, $\Delta$Tya and $\Delta$Tza). As described above, the difference calculator 27, the control compensator 23 and the output distribution matrix 24 constitute the controller.

Thus, calibrating the movement amounts 32 of the optical element 1 using the calibration matrix 22 can cause the optical element positioning apparatus 7 to perform more precise positioning control of the optical element 1.

Figure 3:
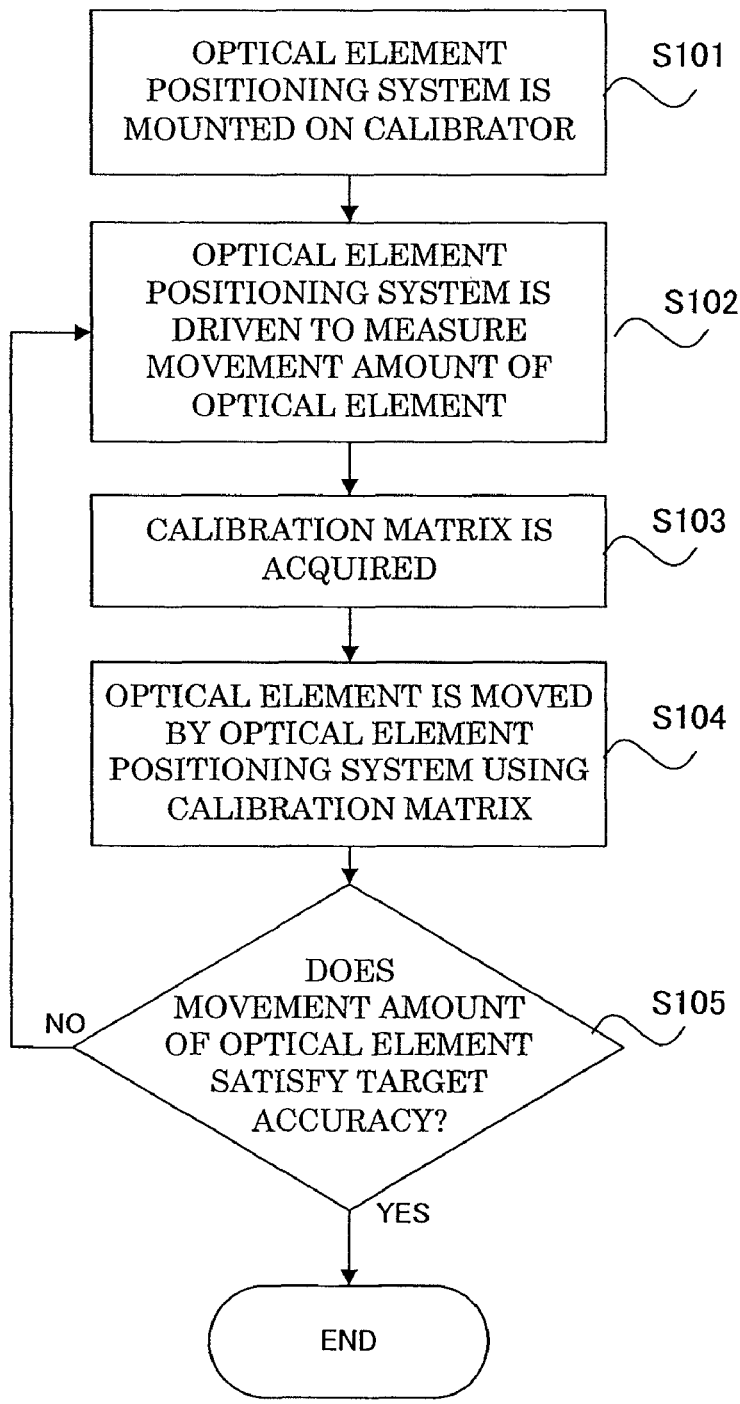
FIG. 3 is a flowchart of a calibration process in Embodiment 1.

Further, it is necessary to move the optical element 1 on the calibrator 200 using the calibration matrix 22 to confirm whether or not the movement amounts of the optical element 1 (optical element positioning apparatus 7) satisfy a target accuracy. When the movement amounts thereof fail to satisfy the target accuracy, the calibration matrix 22 has to be acquired again. FIG. 3 is a flowchart illustrating processes performed by the calibrator 200 for acquiring the calibration matrix 22 for the optical element positioning apparatus 7.

First of all, at step S101, the optical element positioning apparatus 7 is mounted on the calibrator 200. At step S102, the optical element positioning apparatus 7 is driven to measure the movement amounts of the optical element 1. At step S103, the calibration matrix 22 is acquired. Further, at step S104, the calibrator 200 causes the optical element positioning apparatus 7 to move the optical element 1 by using the calibration matrix 22.

Then, at step S105, the calibrator 200 determines whether or not the movement amounts of the optical element 1 satisfy the target accuracy. When the target accuracy is not satisfied, the process returns to step S102 and repeats steps S102 to S105. When the target accuracy is satisfied, the acquiring process of the calibration matrix 22 is terminated.

Next, a description will be made of a method to control wavefront aberration of the projection optical system 101 within a permissible value.

Fixing the base plates 5 of the respective optical element positioning apparatuses 7, which have been calibrated as described above, to the optical element holding barrel 100, completes the assembly of the projection optical system 101. However, when the base plates 5 of the optical element positioning apparatuses 7 are fixed to the optical element holding barrel 100, mounting errors are generated unavoidably. Unless the positions of the base plates 5 are adjusted, the projection optical system 101 cannot correctly focus exposure light on a substrate.

Therefore, the projection optical system 101 is mounted on a wavefront aberration measurement apparatus (not shown) and then, an adjusting member, such as a spacer, is inserted between the base plate 5 and the optical element holding barrel 100 until the wavefront aberration can be measured to adjust the position of the optical element positioning apparatuses 7.

Even when the positions of the optical element positioning apparatuses 7 are only adjusted by using the adjusting member, the wavefront aberration of the projection optical system 101 cannot be controlled within the permissible value. Therefore, the position of each optical element 1 is adjusted using the position adjusting mechanisms 4 in each of the optical element positioning apparatuses 7. With this, the wavefront aberration of the projection optical system 101 can be controlled within the permissible value.

It is preferable to use, as the displacement sensor 6 in the optical element positioning apparatus 7, a displacement sensor having an original point and being capable of measuring an absolute displacement of the optical element 1 on the base plate 5. This enables measurement of the positions of the optical elements 1 (1_m1 to 1_m6), with respect to the base plate 5, when the wavefront aberration is controlled within the permissible value.

It is desired that the positions and angles of the optical elements 1 (1_m1 to 1_m6), in the six-degrees-of-freedom when the wavefront aberration is controlled within the permissible value, be stored in a memory (not shown) provided in the optical element positioning apparatuses 7 (7_m1 to 7_m6) or an exposure apparatus. This configuration can recreate a state in which the wavefront aberration of the projection optical system 101 is controlled within the permissible value in a short time.

Figure 4:
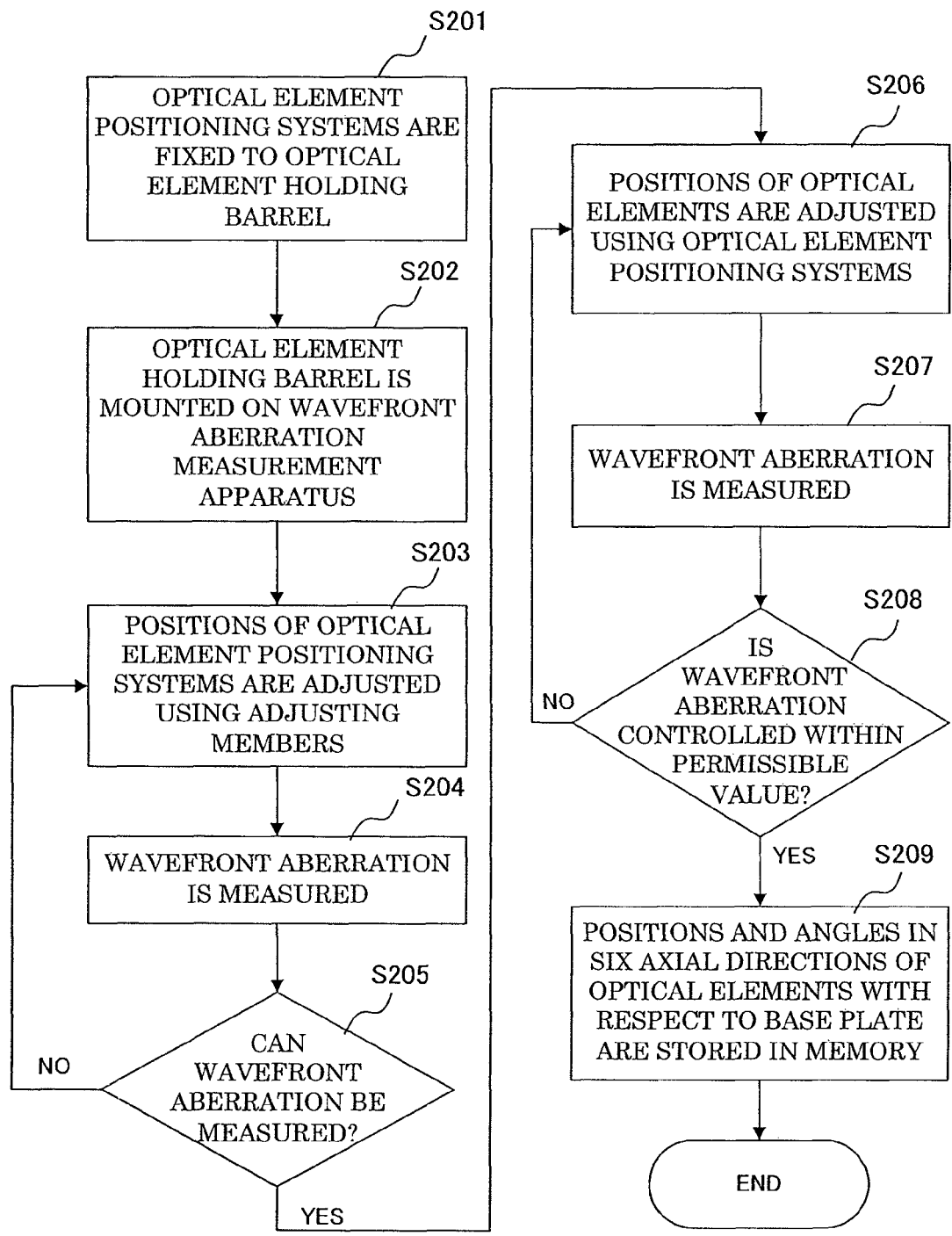
FIG. 4 is a flowchart of an adjustment process of wavefront aberration in Embodiment 1.

FIG. 4 is a flowchart showing an adjustment process to control the wavefront aberration of the projection optical system 101 within a permissible value. First of all, at step S201, each of the optical element positioning apparatuses 7 is fixed to the optical element holding barrel 100. At step S202, the optical element holding barrel 100 is mounted on the wavefront aberration measurement apparatus. At step S203, the positions of the respective optical element positioning apparatuses 7 are adjusted using the adjusting members. At step S204, the wavefront aberration measurement apparatus measures the wavefront aberration of the projection optical system 101.

At step S205, the wavefront aberration measurement apparatus determines whether or not the wavefront aberration of the projection optical system 101 can be measured. If not, the process returns to step S203, wherein the positions of the optical element positioning apparatuses 7 are adjusted again using the adjusting members, and then, the process proceeds to step S204.

When the wavefront aberration can be measured, the process proceeds to step S206, where the position adjusting mechanisms 4 of the optical element positioning apparatuses 7 are driven to adjust the position of the optical elements 1 (1_m1 to 1_m6) in directions in which the wavefront aberration is reduced.

Then, at step S207, the wavefront aberration of the projection optical system 101, in which the positions of the optical elements 1 (1_m1 to 1_m6) have been adjusted by driving the position adjusting mechanisms 4 of the optical element positioning apparatuses 7, is measured. At step S208, it is determined whether or not the measured wavefront aberration is controlled within the permissible value. If not controlled within the permissible value, the process returns to step S206, where the positions of the optical elements 1 (1_m1 to 1_m6) are adjusted again by driving the position adjusting mechanisms 4 of the optical element positioning apparatuses 7 in directions in which the wavefront aberration is reduced, and then, the process proceeds to step S207.

When the wavefront aberration is controlled within the permissible value, the process proceeds to step S209. At step S209, the positions and angles of the optical elements 1 (1_m1 to 1_m6) in the six-degrees-of-freedom are stored in the memory provided in the optical element positioning apparatuses 7 (7_m1 to 7_m6) or the exposure apparatus. Thus, the adjustment process is terminated.

In Embodiment 1, all the optical elements 1 (1m_1 to 1m_6) are driven with the optical element positioning apparatuses 7. However, some of the optical elements 1 (1m_1 to 1_m6) may be directly supported by (or fixed to) the base plate 5 with the holding mechanism 2.

Embodiment 2

The optical element positioning apparatus 7 described in Embodiment 1 uses the displacement sensors 6 mounted on the base plate 5 to measure the positions of the optical element 1 with respect to the base plate.

Figure 5:
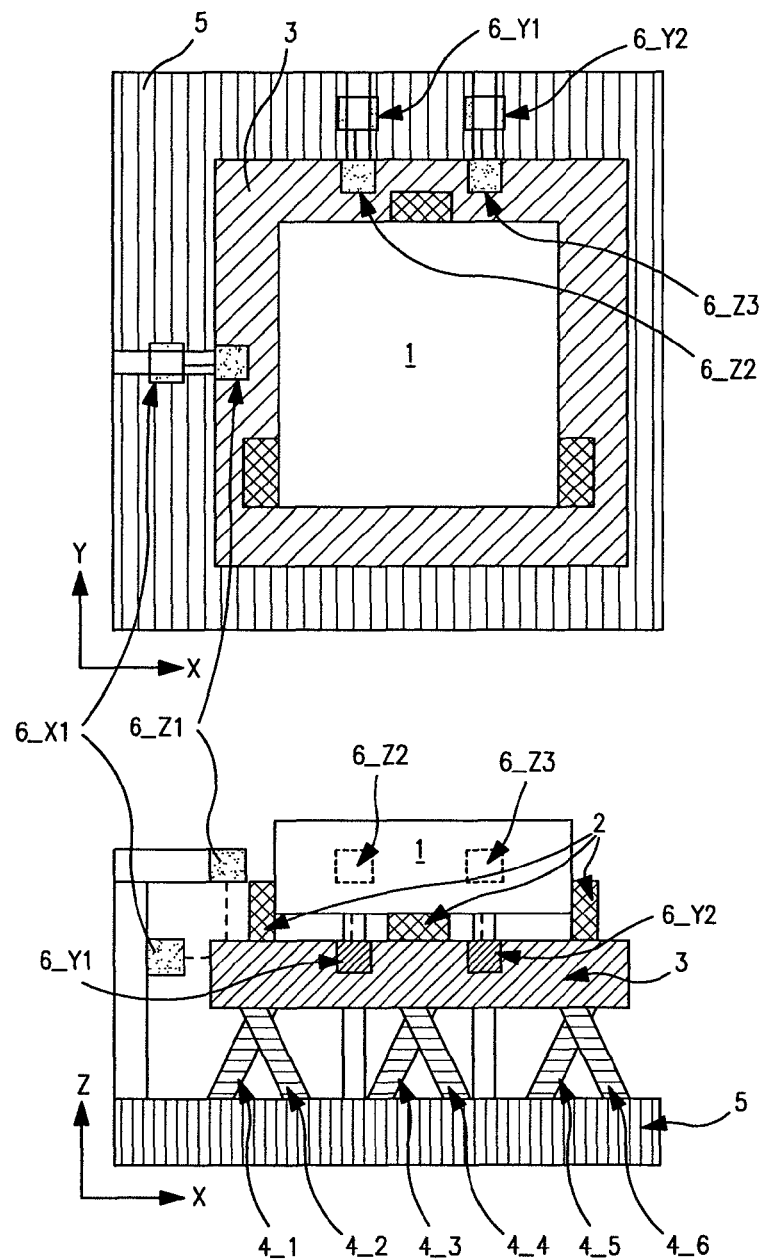
FIG. 5 shows a top view and a side view schematically illustrating the configuration of an optical element positioning apparatus that is Embodiment 2 of the present invention.

However, when the rigidity of the holding mechanism 2 is satisfactorily high and thereby, the optical element 1 and the back plate 3 can be regarded as being integrally moved, as shown in FIG. 5, the displacement sensor 6 (6_X1, 6_Y1, 6_Y2, 6_Z1, 6_Z2, 6_Z3) may be mounted to the base plate 5, to measure the displacement amounts of three points different from each other on the back plate 3 in the Z axial direction, the X axial direction and the Y axial direction.

In this case, the positioning control of the optical element 1 may be carried out in the same manner as that in Embodiment 1, based on the measurement results of the position of the back plate 3 with respect to the base plate 5.

Embodiment 3

Next, an example of a projection exposure apparatus 300, in which a projection optical system shown in the aforementioned Embodiments 1 and 2 is provided, will be described, with reference to FIG. 12.

The exposure apparatus 300 of this embodiment uses EUV light as illumination light, for example, its wavelength is 13.5 nm, to expose onto a substrate 340 as a wafer a circuit pattern formed on an exposure mask 320 by a step-and-scan method, a step-and-repeat method, or the like. This exposure apparatus 300 is suitable for lithography processing in a size of less than a submicron or a quarter micron. Hereafter, this embodiment will describe an exposure apparatus using the step-and-scan method, which is also referred to as a scanner, as an example.

The step-and-scan method is an exposure method in which continuous scanning of a wafer with respect to an exposure mask is performed, to expose a pattern formed on the exposure mask onto the wafer, and the wafer is moved to a next exposure position by a stepped movement, after each shot of the exposure is completed. The step-and-repeat method is an exposure method in which a wafer is moved by a stepped movement after every one-shot exposure of the wafer, and then, the wafer is moved to next exposure position.

Figure 12:
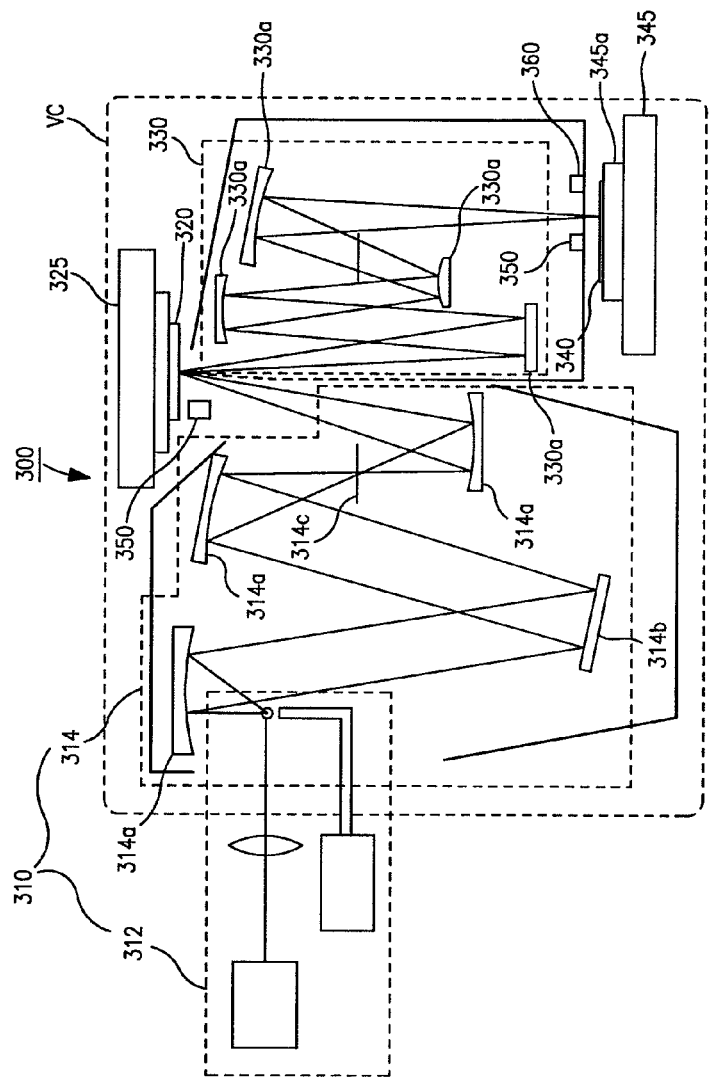
FIG. 12 illustrates an exposure apparatus that is Embodiment 3 of the present invention, to which the optical element positioning apparatus of Embodiments 1 and 2 is applicable.

Referring to FIG. 12, the exposure apparatus 300 includes an illumination apparatus 310 for illuminating the exposure mask 320 with light from a light source, a mask stage 325 for mounting the mask 320, and a projection optical system 330 for introducing the light from the exposure mask 320 to the substrate (wafer) 340. It further includes a wafer stage 345 for mounting the substrate 340, an alignment detection mechanism 30, and a focus position detection mechanism 360.

FIG. 12 shows a catoptric reduction projection optical system including four mirrors between the exposure mask 320, at which the light is reflected and the substrate 340, which the light reaches after the reflection, to simplify the figure. However, six or more than six mirrors are actually provided, as shown in Embodiments 1 and 2.

Further, as shown in FIG. 12, the EUV light has a low transmissivity with respect to atmosphere, and it generates contamination by reaction with residual gas (polymer organic gas, and the like). Thus, at least an inside of a path through which the EUV light passes, that is, an entire optical system is kept in a vacuum atmosphere (VC).

The illumination apparatus 310 illuminates the exposure mask 320 with the EUV light, for example, its wavelength is 13.4 nm, having an arc shape with respect to a view field having an arc shape of the projection optical system 330, and includes an EUV light source 312 and an illumination optical system 314.

The EUV light source 312 employs, for example, a laser plasma source. In the laser plasma source, a high-intensity pulse laser beam is irradiated onto a target member in a vacuum container to generate high-temperature plasma, which irradiates the EUV light, for example, its wavelength is approximately 13 nm. The target member includes a metal layer, a gas jet and a liquid drop. In order to improve the average intensity of the irradiated EUV light, higher cyclic frequency of the pulse laser is desirable, so that the EUV light source 312 is normally driven at a cyclic frequency of several kHz.

The illumination optical system 314 is constituted by a condenser (collective) mirror 314a and an optical integrator 314b. The condenser mirror 314a collects the EUV light substantially isotopically irradiated from the laser plasma. The optical integrator 314b illuminates the exposure mask 320 uniformly with a predetermined NA. Further, the illumination optical system 314 is provided with an aperture 314c for restraining an illumination region of the exposure mask 320 into an arc shape at a position conjugate with the exposure mask 320.

A cooling apparatus may be provided for cooling the condenser mirror 314a and an optical integrator 314b, which are optical members constituting the illumination optical system 314. The cooling of the condenser mirror 314a and the optical integrator 314b prevents their deformation caused by thermal expansions, thereby achieving good image-forming performance.

The exposure mask 320 is a reflective mask, and is formed thereon with a circuit pattern (or an image) to be transferred. The exposure mask 320 is supported and driven by the mask stage 325. Diffracted light from the exposure mask 320 is reflected by the projection optical system 330 described in Embodiments 1 and 2, and then, is projected onto the substrate 340. The exposure mask 320 and the substrate 340 are disposed in an optical conjugate relationship. Since the exposure apparatus 300 employs the step-and-scan method, it projects a reduced pattern of the exposure mask 320 onto the substrate 340 by scanning the substrate 340 with respect to the exposure mask 320.

The mask stage 325 supports the exposure mask 320, and is connected to a transferring mechanism (not shown). The mask stage 325 can employ any kinds of configurations. The transferring mechanism is constituted by a linear motor, or the like, and can move the exposure mask 320 by driving the mask 325 in at least an x-direction. The exposure apparatus 300 relatively scans the exposure mask 320 and the substrate 340 in a state where they are synchronized.

The projection optical system 330 employs a plurality of mirrors 330a formed of a multilayer film to reduce and to project the pattern on a surface of the exposure mask 320 onto the substrate 340, which is an image surface. The number of the plurality of mirrors 330a is equal to or more than six, as described above. In order to realize a wide exposure region with as small a number of mirrors as possible, only a narrow region having an arc shape (field having a ring shape) located away from the optical axis by a certain distance is used to transfer a wide area by simultaneously scanning the exposure mask 320 and the substrate 340.

The mirrors 330a may be cooled to prevent their deformation caused by thermal expansions by a cooling apparatus, thereby achieving good image-forming performance.

Although substrate 340 refers to a wafer in this embodiment, it widely includes a liquid substrate and other kinds of substrates. A photoresist is applied on the substrate 340.

The wafer stage 345 supports the substrate 340 with a wafer chuck 345a. The wafer stage 345 moves the substrate 340 in the x, y and z directions, using a linear motor, or the like. The exposure mask 320 and the substrate 340 are synchronously scanned. The positions of the mask stage 325 and the wafer stage 345 are monitored by laser interferometers, or the like, and both are driven at a certain velocity ratio.

The alignment detection mechanism 350 measures a positional relationship between the exposure mask 320 and an optical axis of the projection optical system 330, and that between the substrate 340 and the optical axis of the projection optical system 330. The positions of and an angle between the mask stage 325 and the wafer stage 345 are set such that the position of a projected image of the exposure mask 320 coincides with a predetermined position on the substrate 340.

The focus position detection mechanism 360 measures a focus position on a surface of the substrate 340, and controls the position and the angle of the wafer stage 345, so as to always maintain the surface of the substrate 340 at a position where the image is formed through the projection optical system 330 during exposure.

During exposure, the EUV light emerging from the illumination apparatus 310 illuminates the exposure mask 320 to form the pattern on the surface of the exposure mask 320 onto a surface of the substrate 340. In this embodiment, the image surface has an arc shape (having a ring shape). The exposure mask 320 and the substrate 340 are relatively scanned at a speed ratio equivalent to a reduction magnification ratio to expose the entire surface of the mask 320.

Next, an embodiment of a method for manufacturing devices using the aforementioned exposure apparatus 300 will be described.

A device, such as a semiconductor integrated circuit element and a liquid crystal display element, is manufactured using the above-mentioned exposure apparatus 300 through a step of exposing a substrate, such as a wafer and a glass plate, on which a photosensitizing agent is applied, a step of developing the exposed substrate, and other well-known steps.

According to the method for manufacturing the device of this embodiment, a device having a higher quality than that of conventional ones can be manufactured.

The method for manufacturing the device using the exposure apparatus 300 and also, the device itself, as a resultant product, constitute aspects of the present invention.

While the present invention has been described with reference to various embodiments, it is to be understood that the invention is not limited to the disclosed exemplary embodiments. Rather, the scope of the following claims is to be accorded the broadest interpretation so as to encompass all modifications, equivalent structures and functions.

For example, each of the aforementioned embodiments describes an optical element positioning apparatus used for a projection optical system in an exposure apparatus that uses EUV light as the exposure light. However, the optical element positioning apparatus can be used with exposure apparatuses that use exposure light other than the EUV light, such as an ArF excimer laser and an $F_2$ laser.

What is claimed is:

1. An apparatus that includes an optical element and positions the optical element, the apparatus comprising:
   a holder configured to hold the optical element;
   a back plate configured to support the optical element via the holder;
   a mechanism configured to move the optical element in six-degrees-of-freedom;
   a base plate configured to support the back plate via the mechanism;
   three first displacement sensors disposed on the base plate and configured to measure respective displacement amounts of three mutually different points on the back plate in a first direction;
   a second displacement sensor disposed on the base plate and configured to measure a displacement amount of one point on the back plate in a second direction different from the first direction;
   two third displacement sensors disposed on the base plate and configured to measure respective displacement amounts of two mutually different points on the back plate in a third direction different from the first and second directions;
   a transformation processor configured to transform the six displacement amounts measured by the first, second and third displacement sensors into displacement amounts of the optical element in the six-degrees-of-freedom;
   a calibration processor configured to calibrate the displacement amounts transformed by the transformation processor with a calibration matrix, of which coefficients are previously obtained, to calibrate the displacement amounts in the six-degrees-of-freedom, which have errors due to measurement errors of the first, second and third displacement sensors; and
   a controller configured to output command values to the mechanism based on differences between the displacement amounts calibrated by the calibration processor and target displacement amounts of the optical element.

2. A projection optical system comprising:
   the apparatus defined in claim 1; and
   a structure configured to support the apparatus.

3. A projection optical system according to claim 2, further comprising a memory configured to store a position of the optical element in the six-degrees-of-freedom when a wavefront aberration of the projection optical system falls within a tolerance.

4. An exposure apparatus comprising:
   a projection optical system defined in claim 2,
   wherein the exposure apparatus exposes a substrate to light via the projection optical system.

5. A method of manufacturing a device, the method comprising:
   exposing a substrate to light using the exposure apparatus defined in claim 4;
   developing the exposed substrate; and
   processing the developed substrate to manufacture a device.

* * * * *